United States Patent
Yglesia et al.

[11] Patent Number: 6,153,449
[45] Date of Patent: Nov. 28, 2000

[54] METHOD FOR CREATING A HERMETIC SEAL AND PACKAGE MADE THEREBY

[75] Inventors: Larry G. Yglesia; Joseph S. Occhipinti, both of Carlsbad; Clark M. Steddom, Rancho Santa Margarita, all of Calif.

[73] Assignee: Brush Wellman Inc., Cleveland, Ohio

[21] Appl. No.: 09/065,978

[22] Filed: Apr. 24, 1998

Related U.S. Application Data

[60] Provisional application No. 60/044,921, Apr. 25, 1997.

[51] Int. Cl.[7] .......................... H01L 21/44; H01L 21/48; H01L 21/50
[52] U.S. Cl. .......................... 438/127; 438/118; 438/106
[58] Field of Search .................................. 438/127, 118, 438/106, 125, 126

[56] References Cited

U.S. PATENT DOCUMENTS

| | | | |
|---|---|---|---|
| 4,622,433 | 11/1986 | Frampton | 174/52 FP |
| 4,882,212 | 11/1989 | SingDeo et al. | 428/76 |
| 5,159,432 | 10/1992 | Ohkubo et al. | 357/74 |
| 5,285,570 | 2/1994 | Fulinara . | |
| 5,475,567 | 12/1995 | Hearn | 361/778 |

OTHER PUBLICATIONS

Strat–E–Film Fine Line Metalization, 1994, StratEdge Corporation.
Low Cost Ceramic Packages for mm–Wave GaAs Ics; StratEdge Corp.; 1994 Horizon House Publications, Inc. (2 pgs.).
A Multilayer Hybrid Substrate; 1994 StratEdge Corporation.
Ceramic Filter Technology; 1994 StratEdge Corporation.
Planar Feedthrough Technology; 1994 StratEdge Corporation.
Model Number SE20–103 DC–20 GHz Ceramic Microwave Package; 1994 StratEdge Corporation.
Model Number SE20–200 DC–20 GHz Ceramic Microwave Package; 1994 StratEdge Corporation.
Model Number SE20–300 DC–20 GHz Ceramic Microwave Package; 1994 StratEdge Corporation.
Model Number SEC–580234 Ceramic Microwave Package; 1994 StratEdge Corporation.
Model Number SEC–580237 Ceramic Microwave Package; 1994 StratEdge Corporation.
Model Number SEC–580236 Ceramic Microwave Package; 1994 StratEdge Corporation.
Model Number SEC–580231 Ceramic Microwave Package; 1994 StratEdge Corporation.
Model Number SEC–580230 Ceramic Microwave Package; 1994 StratEdge Corporation.
Model Number SEC–580235 Ceramic Microwave Package; 1994 StratEdge Corporation.
Model Number SEC–580180 Ceramic Microwave Package; 1994 StratEdge Corporation.
StratEdge Corporation Application Notes; 1994 StratEdge Corporation.

*Primary Examiner*—Andrew Tran
*Assistant Examiner*—Bradley K. Smith
*Attorney, Agent, or Firm*—Calfee, Halter & Griswold LLP; Nenad Pejic

[57] ABSTRACT

A method for creating hermetic seals in semiconductor packages is provided. The method includes the applying a sealing glass to ceramic layers and placing a ceramic tape layer there between. The assemblage is then laminated and fired, or sintered, to marry the material layers together to form a hermetic seal. The hermetic seal made thereby may be incorporated into a wide variety of semiconductor devices including packages and feedthroughs.

15 Claims, 2 Drawing Sheets

6,153,449

METHOD FOR CREATING A HERMETIC SEAL AND PACKAGE MADE THEREBY

This application claims benefit is provisional application 60/044,921 Apr. 25, 1997.

FIELD OF THE INVENTION

The invention relates generally to semiconductor devices and packages, and more particularly, to methods for creating hermetic seals used in the packaging of semiconductor devices.

BACKGROUND OF THE INVENTION

Since their inception, semiconductor devices have played an important role in the technological development of industries and societies. From the first solid state radio, semiconductor devices have evolved in design and application to contemporary computer systems, cellular telephones, radar systems, medical instrumentation, and household appliances. However, the evolution of semiconductor devices was not instantaneous.

Early semiconductor devices were passive and limited to simple junction (i.e., pn junction) devices known as diodes. These simple junction devices, in turn, lead to the development of other devices, such as transistors and integrated circuits. These early semiconductor devices were packaged in epoxies or plastics and had only two or three metal leads for electrical connection.

As the art continues to evolve, complex semiconductor devices are now required in many applications. These complex devices must be capable of operating over a broad frequency and power range. For example, cellular telephones and radar systems require semiconductor devices having high frequency and high power capabilities. Consequently, specialized packages are needed to house these semiconductor devices. These semiconductor packages must be capable of withstanding a plurality of environmental and physical challenges while at the same time providing the packaged semiconductor device with proper electrical connectivity to the outside world.

Because these complex semiconductor designs require a large number of electrical connections to circuitry outside of the semiconductor's package, the semiconductor's package must be constructed with one or more electrical feedthroughs. An electrical feedthrough is a device for providing electrical connectivity between a packaged semiconductor device and external circuitry. Electrical feedthroughs must be particularly constructed with many layers of materials so as to provide insulation from the external housing of a semiconductor package and yet still provide the semiconductor package with the ability to withstand environmental and physical challenges. However, due to this particular construction, it has been heretofore difficult to create hermetic seals in electrical feedthroughs and packages.

A hermetic seal is a seal which does not allow the passage of fluids, including air, through its confines. Prior attempts at forming hermetic seals suffered from a warping or "potato chip" effect which describes a great variance in the structural uniformity of a sealing assembly caused by employing a great number of material layers in the assemblage. Furthermore, these attempts did not consistently result in hermetic seals. Yet other attempts at forming hermetic seals provided fragile sealing assemblies which quickly developed leaks upon minor physical stressing. Accordingly, a method for creating hermetic seals is desirable which does not suffer from the aforementioned defects.

SUMMARY OF THE INVENTION

According to one aspect of the present invention, a method is provided for creating a hermetic seal in electrical feedthroughs and in semiconductor packages.

The method includes the steps of applying a glass layer over opposite sides of at least two ceramic layers. A ceramic tape layer is then placed between the ceramic layers and, more specifically, between the glass layers thereon. The assembly is then laminated and fired (or sintered) to marry the layers into a hermetic seal. Metal layers are then applied to the outer ceramic layers and sides of the assembly to facilitate brazing of the assembly into a package.

It is therefore an advantage of the present invention to provide a method for creating a hermetic seal with a minimum of material layers in electrical feedthroughs and in semiconductor packages.

It is a further advantage of this invention to provide a method for creating a hermetic seal which allows for close tolerances to be maintained in the structure of the hermetic seal.

It is yet a further advantage of the present invention to provide a method and package incorporating a hermetic seal for semiconductor packages.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
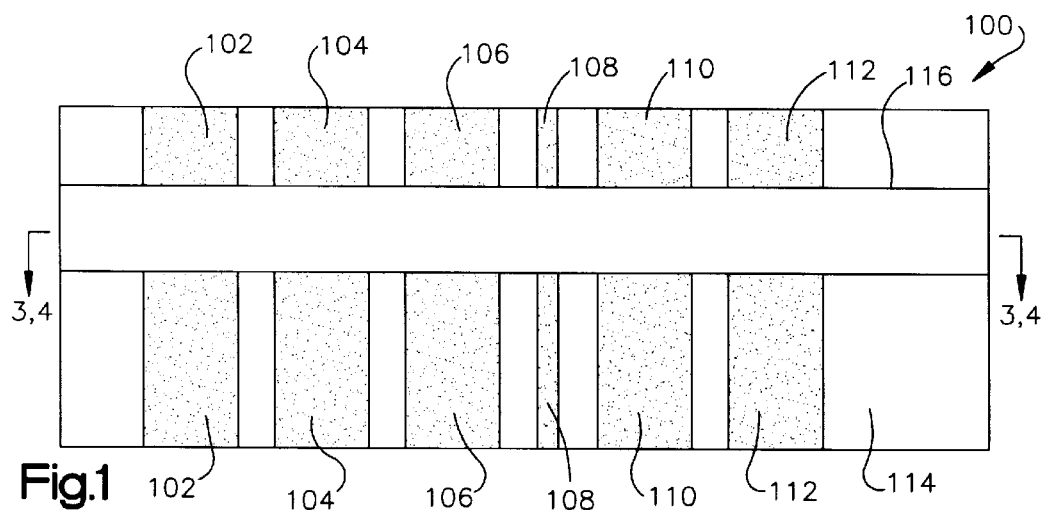
FIGS. 1 and 2 are illustrations of an electrical feedthrough incorporating a hermetic seal created by the present invention.
Figure 2:
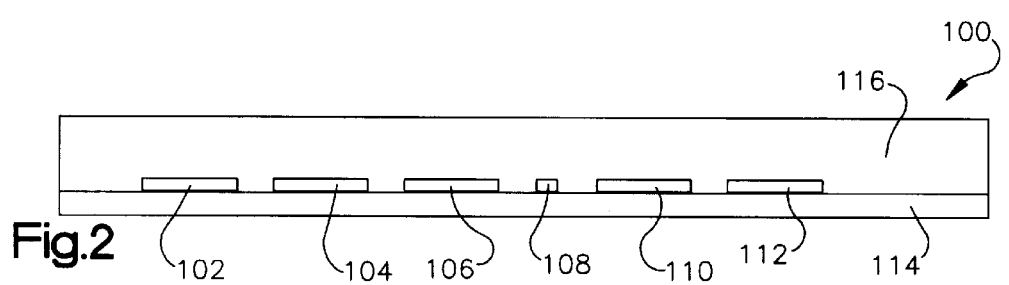

Referring now to the drawings, and particularly to FIGS. 1 and 2, an electrical feedthrough 100 is shown. The feedthrough 100 includes a plurality of electrical leads 102, 104, 106, 108, 110, and 112 on a substructure 114. The feedthrough 100 also includes a sealing assembly 116, which along with substructure 114, formulate a hermetic seal.

Figure 3:
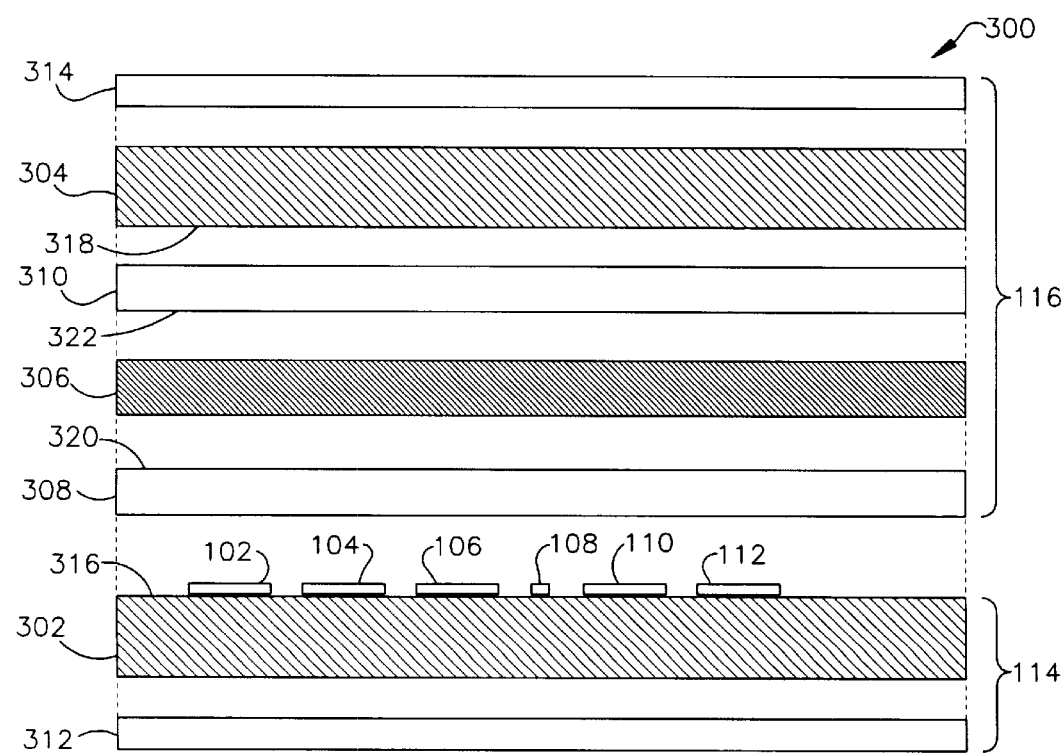
FIG. 3 is an exploded, cross-sectional view of the electrical feedthrough of FIG. 1 along section lines 3,4—3,4.

Referring now to FIG. 3, an exploded sectional view 300 of the feedthrough 100 taken along section line 3,4—3,4 of FIG. 1 is shown. The substructure 114 include a ceramic layer 302 and metal layer 312. The ceramic layer 302 includes electrical leads 102–112 on its top planar surface. The sealing assembly 116 includes ceramic layer 304, ceramic tape layer 306, glass layers 308 and 310, and metal layer 314.

Ceramic layers 302 and 304 are preferably 96% Alumina. However, other suitable ceramics may also be employed, such as 92% or 99% alumina, berylia, titanite, or aluminum nitride. The ceramic tape layer 306 is preferably Lo-Fire Tape D-41010-25C, manufactured by Electro-Science Laboratories, Inc., according to U.S. Pat. No. 4,645,552, which is hereby fully incorporated by reference. However, any ceramic tape manufactured in accordance with U.S. Pat. No. 4,645,552 may be employed. Glass layers 308 and 310 are preferably made from high-temperature (i.e., a firing temperature of 850° C. or above) sealing glass which is commercially available from a number of suppliers including DuPont Corp., Electro-Science Laboratories, Inc., Ferro, Inc., and Heraeus Corp. The glass incorporated into the sealing glass can be any hard, amorphous, inorganic, substance made by fusing silicates, or borates and phosphates, with certain oxides and then rapidly cooled. Metal layers 312 and 314 are preferably a plurality of layers which collectively provide for brazing via conventional methods to a package. The plurality of layers may include brazing paste systems and/or pre-forms.

Still referring to FIG. 3, the various described layers form a hermetic seal through a plurality of process steps to be presently described herein. It should be noted that the specific planar geometry of the ceramic, glass and metal layers may vary based on designer preference and may be formed via a variety of conventional methods. Accordingly, the present invention incorporates such geometry and constructions without detailed discussion so as to maintain the focus of the discussion on the presently described subject matter.

After electrical leads 102–112 have been created on ceramic layer 302, glass layer 308 is applied to surface 316 and thereby over electrical leads 102–112 also, via screen printing. Similarly, glass layer 310 is applied to surface 318 of ceramic layer 304 via screen printing.

Having applied glass layers 308 and 310 to ceramic layers 302 and 304, ceramic tape layer 306 is placed between and in contact with surfaces 320 and 322 of glass layers 308 and 310 respectively. The entire assembly is then laminated and fired (or sintered) at a temperature typically in the range of 850° C. to 1000° C., in air. A suitable laminating schedule would be at 60° C., 500–1000 psi and 5 minutes. A pressure in the lower range of 500–1000 psi is preferred. The firing of the assemblage causes glass layers 308 and 310 to flow into and fill any voids left over from the laminating process to thereby create a hermetic seal.

Figure 4:
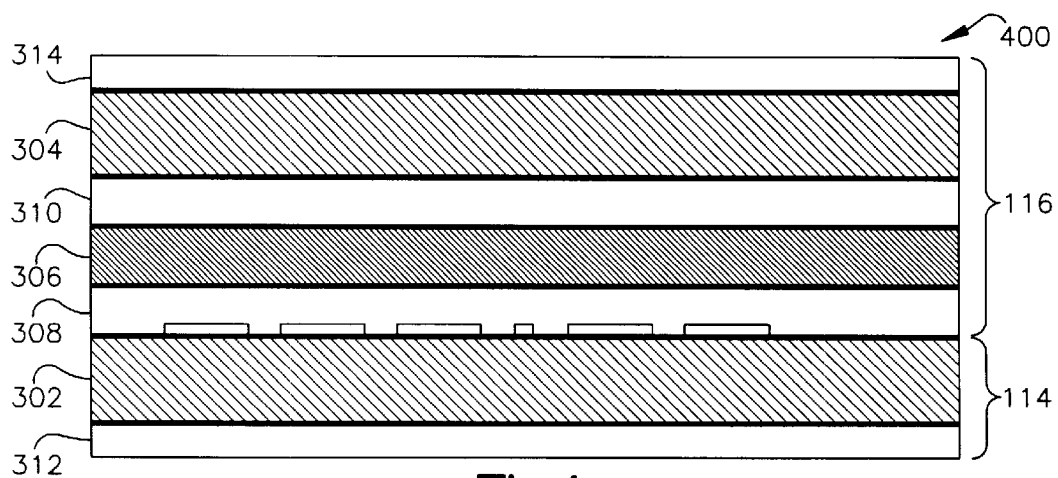
FIG. 4 is cross-sectional view of the electrical feedthrough of FIG. 1 along section lines 3,4—3,4 after laminating and firing (or sintering) the assemblage 300 of FIG. 3.

Referring now to FIG. 4, a cross-sectional view taken along section lines 3,4—3,4 after laminating and firing the assemblage 300 is shown as completed assemblage 400. The substructure 114 and sealing assembly 116, along with their associated layers 302–314, collectively form a hermetic seal preventing the passage of fluids through their confines. One or more metal layers may be applied to the sides of the assemblage in order to facilitate brazing of the assemblage. These metal layers may be brazing systems or preforms, as described above. The height of the assemblage 400 may be controlled by defining the heights of the constituent layers of the substructure 114 and sealing assembly 116. The assemblage 400, once constructed may be incorporated by wire bonding, welding, and brazing into a variety of metal housings, such as Kovar, CuW, CuMo, CuMoCu, ALSiC and E materials. In this manner, given the small number of material layers required to form a hermetic seal, tight tolerances may be maintained throughout the assemblage.

Figure 5:
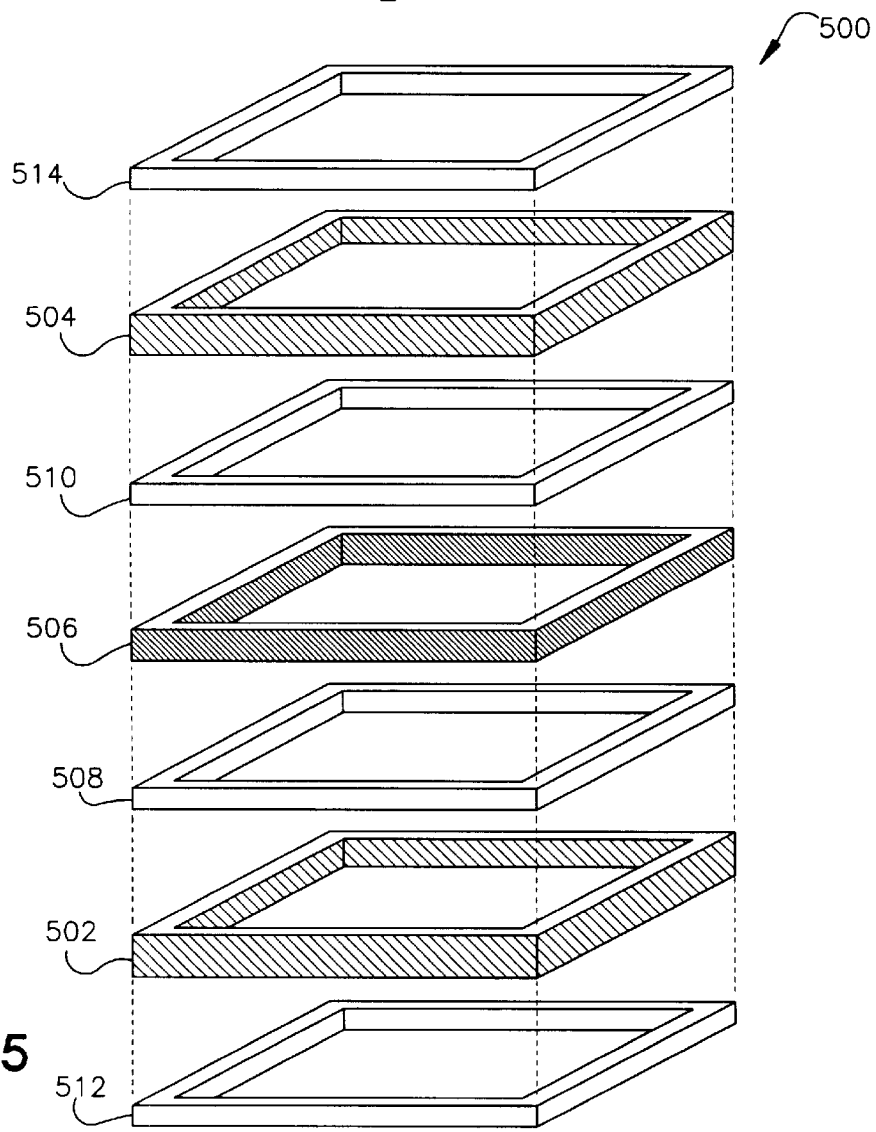
FIG. 5 is an exploded perspective view of a semiconductor package incorporating the hermetic seal of the present invention with top and bottom plates not shown.

Illustrated in FIG. 5 is an exploded perspective view of a package 500 with top and bottom plates not shown. The package 500 is constructed according the described method of the present invention so as to create a hermetic seal. Specifically, the package 500 includes ceramic layers 502 and 504, ceramic tape layer 506, glass layers 508 and 510, and metal layers 512 and 514. These layers are of identical composition as described above in relation to FIGS. 1–4. Additionally, the layers of FIG. 5 are assembled in like manner to the above description. Accordingly, after the steps of laminating and firing (or sintering) the assembly at a temperature in the range of 850° C. to 1000° C., a hermetic seal is created in the assembly. Thereafter, the top and bottom plates may be brazed to metal layers 512 and 514 by conventional methods to complete the package. It should be further noted that the layers 502–514 may have apertures or opening formed therein for electrical feedthroughs. The design and placement of these apertures or openings is dependent on designer preferences and therefore will not be discussed in detail.

While the present invention has been illustrated by the description of embodiments thereof, and while the embodiments have been described in considerable detail, it is not the intention of application to restrict or in any way limit the scope of the appended claims to such detail. Additional advantages and modifications will readily appear to those skilled in the art. For example, more of less layers in accord with the present invention may be stacked in order to further increase the physical dimensions of the hermetic seal, the planar geometry of the material layers may be modified so as to create rectangular, cylindrical, triangular, and etc., assemblies. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A method for creating a hermetic seal used in the packaging of semiconductor devices, the method comprising the steps of:

(a) placing a first glass layer in contact with a first ceramic;

(b) placing a second glass layer in contact with a second ceramic;

(c) placing a ceramic tape layer in contact with the first and second glass layers so as to form an assemblage;

(d) laminating the assemblage; and (e) heating the assemblage to create flow in the glass layers.

2. The method of claim 1 wherein the step of placing a first glass layer in contact with a first ceramic layer comprises the step of screen printing the first glass layer onto the first ceramic layer.

3. The method of claim 1 wherein the step of placing a second glass layer in contact with a second ceramic layer comprises the step of screen printing the second glass layer onto the second ceramic layer.

4. The method of claim 1 wherein the step of laminating the assemblage comprises the step of laminating the assemblage at 500–1000 psi.

5. The method of claim 1 wherein the step of heating the assemblage to create flow in the glass layers comprises the step of heating the assemblage at a temperature in the range of 850–1000° C.

6. The method of claim 4 wherein the step of laminating the assemblage comprises the step of laminating the assemblage at a temperature of about 60° C.

7. A method for creating a hermetically sealed package for a semiconductor device, the method comprising the steps of:

(a) placing a first glass layer in contact with a first ceramic;

(b) placing a second glass layer in contact with a second ceramic;

(c) placing a ceramic tape layer in contact with the first and second glass layers so as to form an assemblage;

(d) laminating the assemblage; and (e) heating the assemblage to create flow in the glass layers.

8. The method of claim 7 further comprising the step of forming one or more apertures in the assemblage.

9. The method of claim 8 further comprising the step of forming attaching electrical leads for connectivity of the semiconductor device to circuits external to the package.

10. The method of claim 7 wherein the step of placing a first glass layer in contact with a first ceramic layer comprises the step of screen printing the first glass layer onto the first ceramic layer.

11. The method of claim 7 wherein the step of placing a second glass layer in contact with a second ceramic layer comprises the step of screen printing the second glass layer onto the second ceramic layer.

12. The method of claim 7 wherein the step of laminating the assemblage comprises the step of laminating the assemblage at 500–1000 psi.

13. The method of claim 7 wherein the step of heating the assemblage to create flow in the glass layers comprises the step of heating the assemblage at a temperature in the range of 850–1000° C.

14. A method of fabricating a semiconductor device comprising the step of providing a semiconductor package by:

(a) placing a first glass layer in contact with a first ceramic;

(b) placing a second glass layer in contact with a second ceramic;

(c) placing a ceramic tape layer in contact with the first and second glass layers so as to form an assemblage;

(d) laminating the assemblage; and (e) heating the assemblage to create flow in the glass layers.

15. The method of claim 14 further comprising the step of providing a semiconductor inside the package.

* * * * *